(12) United States Patent
Gentillet et al.

(10) Patent No.: US 10,430,547 B2
(45) Date of Patent: Oct. 1, 2019

(54) UNIVERSAL CIRCUIT DESIGN SYSTEMS AND METHODS

(71) Applicant: ORACLE INTERNATIONAL CORPORATION, Redwood Shores, CA (US)

(72) Inventors: Jerome Gentillet, Redwood Shores, CA (US); Harshad Desai, Santa Clara, CA (US); David Scott Green, Redwood Shores, CA (US)

(73) Assignee: Oracle International Corporation, Redwood Shores, CA (US)

( * ) Notice: Subject to any disclaimer, the term of this patent is extended or adjusted under 35 U.S.C. 154(b) by 74 days.

(21) Appl. No.: 15/864,334

(22) Filed: Jan. 8, 2018

(65) Prior Publication Data

US 2019/0213299 A1  Jul. 11, 2019

(51) Int. Cl.
*G06F 17/50* (2006.01)
*G06F 16/2455* (2019.01)

(52) U.S. Cl.
CPC ...... *G06F 17/5081* (2013.01); *G06F 16/2455* (2019.01); *G06F 17/5072* (2013.01)

(58) Field of Classification Search
CPC .................................................. G06F 17/5081
USPC ....................................................... 716/122
See application file for complete search history.

(56) References Cited

U.S. PATENT DOCUMENTS

| | | | |
|---|---|---|---|
| 5,870,308 A * | 2/1999 | Dangelo | G06F 17/50 716/104 |
| 6,983,236 B1 * | 1/2006 | Karlovac | G06Q 30/0603 703/22 |
| 7,353,467 B2 | 4/2008 | Robertson et al. | |
| 7,441,219 B2 | 10/2008 | Perry et al. | |
| 2,487,485 A1 | 2/2009 | Iotov | |
| 7,966,588 B1 * | 6/2011 | Perry | G06F 17/5036 707/E17.107 |
| 8,103,987 B2 | 1/2012 | Banerjee et al. | |
| 8,572,004 B2 * | 10/2013 | Cases | G06F 17/5009 706/10 |
| 8,972,751 B2 * | 3/2015 | Perry | G06F 17/505 703/1 |
| 9,087,164 B2 | 7/2015 | Perry et al. | |
| 2002/0035517 A1 * | 3/2002 | Kitagaw | G06Q 30/06 716/100 |
| 2004/0268283 A1 * | 12/2004 | Perry | G06F 17/5045 716/119 |
| 2005/0278670 A1 * | 12/2005 | Brooks | G05B 19/409 703/6 |

(Continued)

*Primary Examiner* — Suresh Memula
(74) *Attorney, Agent, or Firm* — Fish IP Law, LLP

(57) ABSTRACT

A universal circuit design environment that designs universal circuits that can be applied to a variety of applications is disclosed. The system cross-references attribute requirements of each contemplated application against components to select application set components that are used to populate the universal design circuit environment for use in a universal circuit design. The set components are capable of satisfying every resolvable attribute requirement of the variety of applications, and the universal circuit may be designed with specialized inputs to set some attributes of the universal circuit. Preferably, the footprint of each set component and universal circuit is preserved between versions to allow for optimized updating between component versions.

21 Claims, 4 Drawing Sheets

(56) References Cited

U.S. PATENT DOCUMENTS

| | | | |
|---|---|---|---|
| 2008/0244491 A1* | 10/2008 | Ganesan | G06F 17/5031 |
| | | | 716/100 |
| 2010/0325599 A1* | 12/2010 | Perry | G06F 17/50 |
| | | | 716/122 |
| 2011/0320998 A1 | 12/2011 | Perry et al. | |
| 2015/0128102 A1* | 5/2015 | Perry | G06F 17/5072 |
| | | | 716/137 |
| 2016/0012171 A1* | 1/2016 | Visconti | G06F 17/5072 |
| | | | 716/122 |

* cited by examiner

UNIVERSAL CIRCUIT DESIGN SYSTEMS AND METHODS

FIELD OF THE INVENTION

The field of the invention is circuit design systems and methods.

BACKGROUND

The background description includes information that may be useful in understanding the present invention. These and all other extrinsic materials discussed herein are incorporated by reference in their entirety. Where a definition or use of a term in an incorporated reference is inconsistent or contrary to the definition of that term provided herein, the definition of that term provided herein applies and the definition of that term in the reference does not apply. It is not an admission that any of the information provided herein is prior art or relevant to the presently claimed invention, or that any publication specifically or implicitly referenced is prior art.

Circuit designers often need to design circuits to satisfy build requirements by incorporating a wide variety of components into a single circuit design. For example, U.S. Pat. No. 6,983,236 to Karlovac (hereinafter "Karlovac") teaches a computerized discovery tool that provides constraint-based selection for design components. Karlovac's system, however, fails to take into consideration how a circuit designer might need to implement the components in a circuit design.

U.S. Pat. No. 7,441,219 to Perry (hereinafter "Perry '219") teaches a method for creating, modifying, and simulating circuits. Perry '219"s system, however, only allows a user to cater the simulated circuit towards a circuit design specific to the user's situation and fails to allow a user to design a circuit that can be applied to many different situations. When a new circuit is designed for a specific situation using Perry '219's methods, it is difficult to use that same new circuit design across different products that have differing constraints (e.g. mechanical, thermal, electrical, manufacturing).

U.S. Pat. No. 9,087,164 to Perry (hereinafter "Perry '164") teaches a method for virtualizing tradeoffs between circuit designs. Perry '164's system, however, only allows a user to choose a circuit that is preferred for a certain weighted scoring system, and fails to generate circuit designs that can be applied to many disparate different situations.

Thus, there is still a need in the art for improved circuit design systems and methods.

SUMMARY OF THE INVENTION

The present invention provides apparatus, systems, and methods in which a system generates a universal circuit design that can be leveraged across a plurality of products with a wide range of constraints. As used herein, a "universal" circuit design is a circuit design that can be adapted to apply to a variety of applications, each with its own set of requirements. In some embodiments, the universal circuit design has manual or electronic input toggles that allow some of its attributes, such as an internal resistance or input/output voltage, to be set/reset to adapt the component to a different application.

Generally, the system generates the universal circuit design by populating a circuit design environment with selected application set components for a universal circuit design based on a received circuit type. The system selects the populated application set components by processing the received circuit type in several stages. As used herein, an "application set component" comprises a circuit component that satisfies the requirements of all applications within a set of applications.

The system preferably has an application database with applications that correspond with each circuit type, an attribute requirement database with attribute requirements that correspond with each application in the application database, and a component database with components that correspond with one or more attribute requirements.

A user of the system inputs a circuit type to design, for example a voltage regulator circuit, an electronic circuit breaker circuit or a fan speed control circuit. In some embodiments, the user could also input a set of applications corresponding to the circuit type. In preferred embodiments, the user queries the application database using the circuit type and select applications for which the circuit is designed via a user interface. In some embodiments, the system will automatically query the application database as a function of the circuit type to glean a set of applications associated with the circuit type, which the user could add to or cull after the automated query completes.

The system preferably queries the attribute requirement database as a function of the set of applications to glean a set of attribute requirements associated with each of the set of applications. For example, the system could submit a query for a circuit that will be installed in a CPU, DDR, and a PCIE device—three different applications. The system would then return three sets of attribute requirements associated with each of the three applications. This provides the system with a library of attribute requirements that are specific to the set of applications. Contemplated attribute requirements comprise mechanical, thermal, electrical, and manufacturing constraints.

The system analyzes the attribute requirements and resolves them to generate a set of resolved attribute requirements that intersect each of the set of attribute requirements for each of the selected set of applications. For example, where a first application has an attribute requirement for an output voltage of at least 0.6 V and a second application has an attribute requirement for an output voltage of at least 0.10 V, the system will set the resolved attribute requirement for the output voltage to at least 0.10V. Or where a first application has an attribute requirement of a clockspeed of less than 400 ms, and a second application has an attribute requirement of a clockspeed of between 200 ms and 500 ms, the system will set the resolved attribute requirement for the clockspeed to be between 200 ms and 400 ms. The system generally selects the broadest resolved attribute requirement possible that satisfies each of the selected application attribute requirements.

In some embodiments, a resolved attribute requirement cannot be resolved, such as where the attribute requirements are diametrically opposed (e.g. requires vias and requires no vias) or have no intersect (e.g. input voltage of at most 4.0 V and an input voltage of at least 5.0 V). In such embodiments the system preferably triggers a warning for the detected unresolved resolved attribute requirement. In some embodiments, the warning may be sent as an alert to a user to manually resolve the resolved attribute requirement. Generally, a user will group or split the set of applications into subsets of applications where all of the attributes in a subset overlap can be resolved so that it is possible to design a common universal circuit that satisfies each of the attributes in a subset of applications. The common universal circuit can then be built with available components that have the required functions and features to support the range of attributes for each subset of applications. Attribute requirements that fall beyond the range of the available components for one subset of applications are simply separated into a separate subset (e.g. another circuit design for a separate subset of applications using a different set of available components).

In other embodiments where the resolved attribute requirement cannot be resolved, the system automatically separates the universal circuit design into two or more separate universal circuit designs—one for each set of non-intersecting resolved attribute requirements. Preferably, the system separates the universal circuit design into a minimum number of non-intersecting sets of resolved attribute requirements (one for each set of applications) to minimize the number of circuit designs built for a circuit type.

The resolved attribute requirements could be used to query the component database to select application set components that have features that can support the resolved attribute requirements. In some embodiments, the query is assisted by a user, which inputs at least some of the generated set of resolved attribute requirements into the component database as a filter and manually selects components that are returned by the system. Such an embodiment is preferred as a human user is able to take into account design practicality and subjective costs into account. In other embodiments, the query is automatically executed by the system, which automatically selects application set components that satisfy all resolved attribute requirements for a given set of applications.

The system then populates a universal circuit design environment with the application set components so that a user of the system can design and generate a universal circuit design capable of satisfying all of the resolved attribute requirements of a set of applications. The system generates a basic built-in design guidance and an online more detailed design guide document as a function of the resolved attribute requirements to be provided to the user as a methodology or as a checklist of limitations to interactively check before, during, and after design to ensure that the resolved attribute requirements are satisfied. The design guide could also provide a set of electrical, mechanical, and/or manufacturing attributes that the universal circuit design environment automatically checks and highlights conflicts if any attribute of the universal circuit does not satisfy a resolved attribute requirement. In some embodiments, the design guide provides the electrical, mechanical, and manufacturing attributes through a built-in file that is included with the universal circuit demonstrating the basic guidelines of use of the universal circuit. The very detailed guideline documentation is available through an online section of system for users that require more information.

The system also preferably generates built-in localized constraint regions to resolve mechanical and/or manufacturing attribute conflicts between the application and the universal circuit. As used herein, a "localized constraint region" comprises parameters dedicated towards the universal design circuit, which may be different from global parameters applied to an application which the universal design circuit is applied to. In some embodiments, the system automatically generates a set of localized constraint region parameters by default as a function of the resolved attribute requirements.

In other embodiments, the system automatically applies the resolved attribute requirements to the circuit design environment to prevent a user of the circuit design environment from violating any of the resolved attribute requirements. For example, the system could deactivate features of the circuit design environment as a function of the set of resolved attribute requirements. In other embodiments, the system generates one or more sets of violation conditions as a function of a resolved attribute requirement, and embeds that violation condition in a test for the universal circuit design. When the system simulates the universal circuit design, the circuit design environment could check if the violation condition has been satisfied. If it has, the system triggers a warning that the universal circuit design needs to be redesigned.

Various objects, features, aspects and advantages of the inventive subject matter will become more apparent from the following detailed description of preferred embodiments, along with the accompanying drawing figures in which like numerals represent like components.

DETAILED DESCRIPTION

The following discussion provides example embodiments of the inventive subject matter. As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

It should be noted that any language directed to a computer should be read to include any suitable combination of computing devices, including servers, interfaces, systems, databases, agents, peers, Engines, controllers, or other types of computing devices operating individually or collectively. One should appreciate the computing devices comprise a processor configured to execute software instructions stored on a tangible, non-transitory computer readable storage medium (e.g., hard drive, solid state drive, RAM, flash, ROM, etc.). The software instructions preferably configure the computing device to provide the roles, responsibilities, or other functionality as discussed below with respect to the disclosed apparatus. In especially preferred embodiments, the various servers, systems, databases, or interfaces exchange data using standardized protocols or algorithms, possibly based on HTTP, HTTPS, AES, public-private key exchanges, web service APIs, known financial transaction protocols, or other electronic information exchanging methods. Data exchanges preferably are conducted over a packet-switched network, the Internet, LAN, WAN, VPN, or other type of packet switched network. The following description includes information that may be useful in understanding the present invention. It is not an admission that any of the information provided herein is prior art or relevant to the presently claimed invention, or that any publication specifically or implicitly referenced is prior art.

Two computer systems that are "functionally coupled to" one another are electronically coupled to one another through wired or wireless means in such a way to communicate electronic data from one computer system to another computer system. Preferably, computer systems are coupled to one another through a network system, which could be wired or wireless, could use one or many protocols to connect the devices, and/or could communicate through a LAN, intranet or the Internet, or other suitable networking means.

One should appreciate that the disclosed subject matter provides many advantageous technical effects including generation of a universal circuit design that can be applied to a plurality of different applications to reduce resources (cost and time) needed to design an application and/or product. Automation of the process and methodology severely reduces implementation errors.

Figure 1:
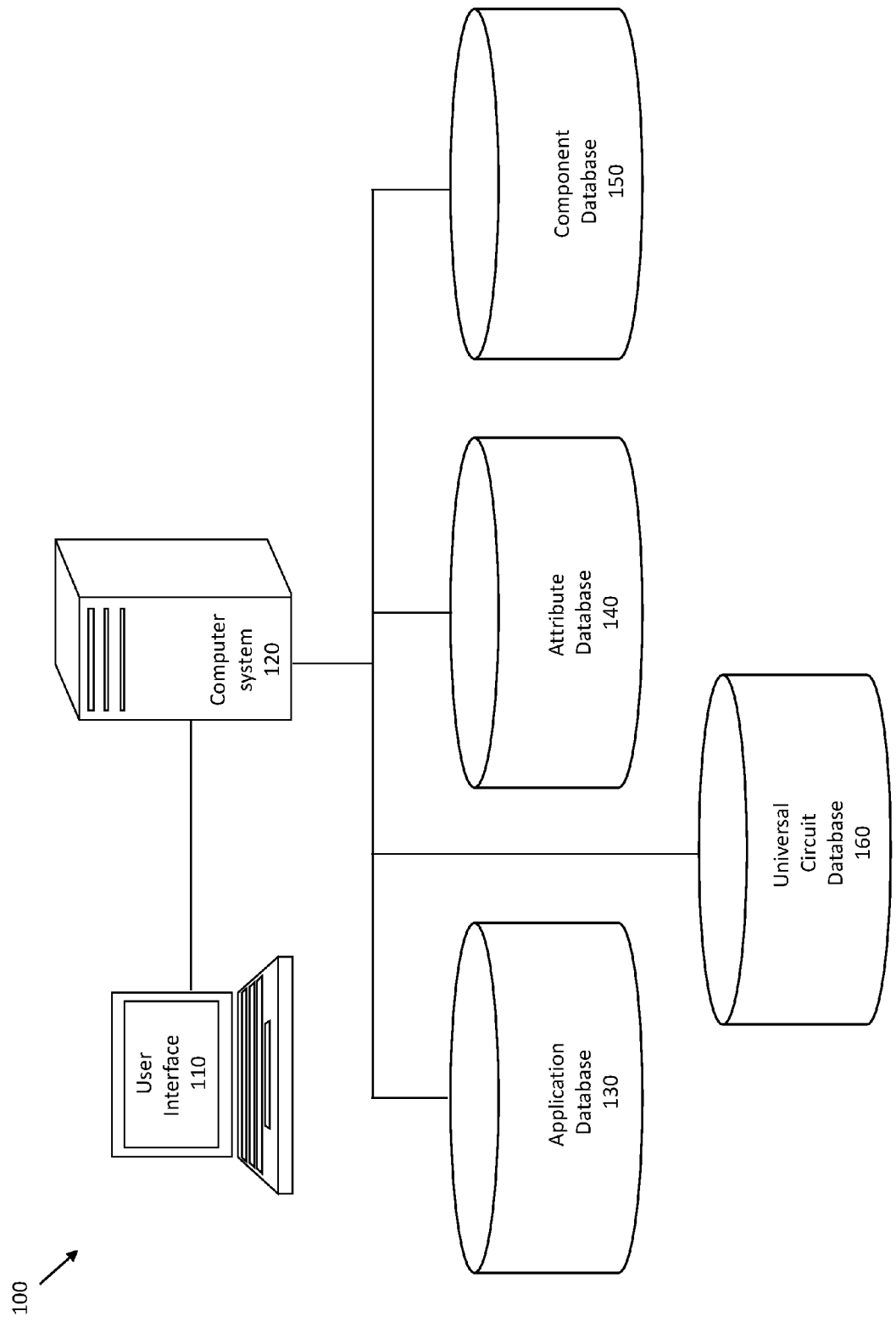
FIG. 1 shows a computer system programmed to assist a user in generating a universal circuit design.

In FIG. 1, an exemplary computer system 100 has a computer system 120 that is functionally coupled to application database 130, attribute database 140, component database 150, and universal circuit database 160.

Computer system 120 is accessible by a user interface 110, which is shown as a single computer terminal having an input keyboard and an output display screen, but could be distributed among one or more other I/O interfaces, such as a touch screen, mouse, keypad, trackball, speakers, microphone, motion tracker, storage drives or even a self-contained desktop computer system functionally coupled to computer system 120. While only one user interface is shown, user interface 110 can also represent any number of user interfaces functionally coupled to computer system 120, where each distinct user interface serves as an input from one or more working on one or more universal chip designs or application designs. In some embodiments, user interface 110 comprises a portal system that allows one or more users to work on the same computer system 120 from any number of discrete locations.

Likewise, computer system 120 is shown as a single computer having a processor and a non-transient computer-readable medium with software instructions that are programmed to perform the functions disclosed herein, but could be distributed among a plurality of computers connected through suitable network connections or on a cloud computing system. While user interface 110, computer system 120, application database 130, attribute database 140, component database 150, and universal circuit database 160 are shown as directly functionally coupled to one another using physical wires, the systems could be functionally coupled together using any suitable network connection, and may have many intermediary systems between them. While user interface 110, computer system 120, application database 130, attribute database 140, component database 150, and universal circuit database 160 are shown as physically separate hardware components, two or more elements could be integrated into a single computer system casing if need be.

Application database 130, attribute database 140, component database 150, and universal circuit database 160 are shown here as separate storage devices functionally coupled to computer system 120 via network connections, but could be integrated into a single storage system, a single logical database, distributed among a plurality of storage systems, or could even be saved on local storage of computer system 120. As used herein, the term "database" means any data structure suitable for storing data, typically on a non-transient computer-readable medium or other persistent storage device, using any suitable structure capable of retrieving data based upon attributes associated with the data.

User interface 110 provides a functional gateway through which a user accesses the system and inputs commands used to generate a universal circuit design. Computer system 120 provides a computer processor that executes computer code saved on its non-transitory computer-readable medium, which in turn executes the functions described herein to transmit/receive data with each of application database 130, attribute database 140, component database 150, and universal circuit database 160.

Application database 130 provides a data storage medium which stores application identifiers that correspond with circuit types. As used herein, the term "application" refers to a hardware electronic component, such as a chip or a board. For example, exemplary applications comprise a CPU, a DDR, a chipset, a PCIE, an I/O bus, a power converter, a voltage converter, and a non-isolated voltage regulator. As used herein, an "application identifier" comprises an identifier of an application, which is usually alphanumeric. The application database could also store applications with an application identifier that also includes a product designator. For example, a CPU that is designed for a desktop computer might have different application identifier associated with it than a CPU that is designed for a laptop computer. Application database 130 preferably saves application identifiers that identify both an application and a product so that attribute requirements associated with the application be as specific as possible. When a system searches for a circuit type in application database 130, application database 130 preferably returns a set of application identifiers that correspond with that circuit type, such as applications for which the circuit type has historically been used.

For example, a search for an AC voltage regulator circuit type in application database 130 could result in a first set of application identifiers while a search for a DC voltage regulator circuit type could result in a second set of application identifiers. The first and second set of application identifiers may be completely overlapping, partially overlapping, or completely non-overlapping. Application database 130 could be populated with applications and matching circuit types in a variety of ways, for example by users of the system manually inputting such data via user interface 110 or by users of the system manually importing data from 3$^{rd}$ party sources (not shown) via user interface 110.

Preferably, the system automatically populates application database 130 with historical applications that the circuit type has been used in. Preferably the application database is updated periodically as users of computer system 120, or of other systems (not shown), use a circuit type in applications that are not currently saved in application database 130. An administrator user could manually define and/or update application database 130, for example by deleting applications that are no longer used with certain circuit types or by adding new applications that have recently been used with certain circuit types. In some embodiments, the system could automatically filter the results list of the set of applications as a function of its historical use, for example only selecting sets of applications that have been associated with that circuit type within a threshold time period (e.g. 2 years), or by selecting sets of applications that have been associated with that circuit type a minimum threshold number of times (e.g. 10 times). In some embodiments, the system provides a user with a set of applications associated with the circuit type, and the user then selects a subset of the set of applications for which the new universal circuit will be designed for.

Attribute database 140 provides a data storage medium which holds attribute requirement identifiers that correspond with application identifiers. Attribute requirements could include, for example, electrical attributes (e.g. capacitance, voltage, current, efficiency, EMI), physical attributes (e.g. maximum height), thermal attributes (e.g. minimum temperature, maximum temperature, required airflow), and feature requirements (e.g. discrete compensation component requirement, I/O logic requirement, power good requirement, or a fault signal requirement).

Preferably, the system automatically populates attribute requirement database 140 with historical attribute requirements specific to each application identifier. In other embodiments, an admin user could manually update and/or populate attribute requirement database 140 with projected attribute requirements based on a future roadmap. In some embodiments, attribute requirement database 140 is updated periodically as users of computer system 120, or of other systems (not shown), define attribute requirements for application identifiers. In some embodiments, each application identifier only has a single set of attribute requirements. If an application has a plurality of attribute requirements, the system will preferably branch the application identifier into application/product designators to ensure that each defined application identifier in application database 130 has a one-to-one correlation with a set of attribute requirements in attribute database 140. In other embodiments the system will provide a user with a set of attribute requirements that match a set of selected applications, from which the user picks a subset of attribute requirements to apply to the new universal circuit.

Component database 150 provides a data storage medium which holds components that correspond with one or more attribute requirements or preferably one or more ranges of attribute requirements. For example, an output voltage of a component could range from 0.5 V to 5 V. The component database generally associates each component with a set of attributes and/or a set of attribute ranges. Preferably, the database is configured such that the system can query the database with a set of attribute requirements, and the component database returns a set of components that satisfies the set of attribute requirements in the query. Preferably, the system automatically populates component database 150 with known components with known attribute requirements. Preferably the application database is updated periodically as users of computer system 140, or of other systems (not shown), populate component database 150 with new components, or update existing components with new versions. An administrator user can manually update component database 150 in some embodiments, particularly when a new version of a component is released. In some embodiments, the system will provide a user with a set of matching components that match a set of selected attribute requirements, from which the user picks a subset of components to apply to the new universal circuit.

Over time, the components saved in component database 150 may be updated from version to version. Preferably, each component has a set of defined attributes that do not vary from version to version, for example a size, a number of metals, an input voltage, or a location of input/output pins. The system preferably prevents new components from being saved that have attributes that do not align with the set of defined attributes, for example, by providing an error message to a user that attempts to update a component having a different location of an output pin than before. The defined attributes preferably keep the foundational footprint of the circuit design consistent from version to version. The system also preferably informs a user of a universal circuit design environment that a component used in a universal circuit design has been updated, for example when a universal circuit design has been opened by a user, or when a user attempts to compile a universal circuit design. Since the footprint of a set component does not change from one version to the next, when a set component is updated in a universal circuit design (which may be used in a design in a plurality of places), the set component can be updated throughout the universal circuit design without having to re-import, re-position, and re-connect the updated component across the universal circuit design.

Universal circuit database 160 stores the universal circuits generated by users of the system. A user could then search for a universal circuit as a function of an application, knowing that the universal circuit can be used for that application and satisfy all of the application's requirements, whatever they are. In some embodiments, a universal circuit may be updated as components or application requirements are updated. A chip comprising one or more instances of the selected universal circuit can then be updated with the new version by pulling the new version from the library, replacing all versions of the universal circuit when an update request is sent from a user.

Figure 2:
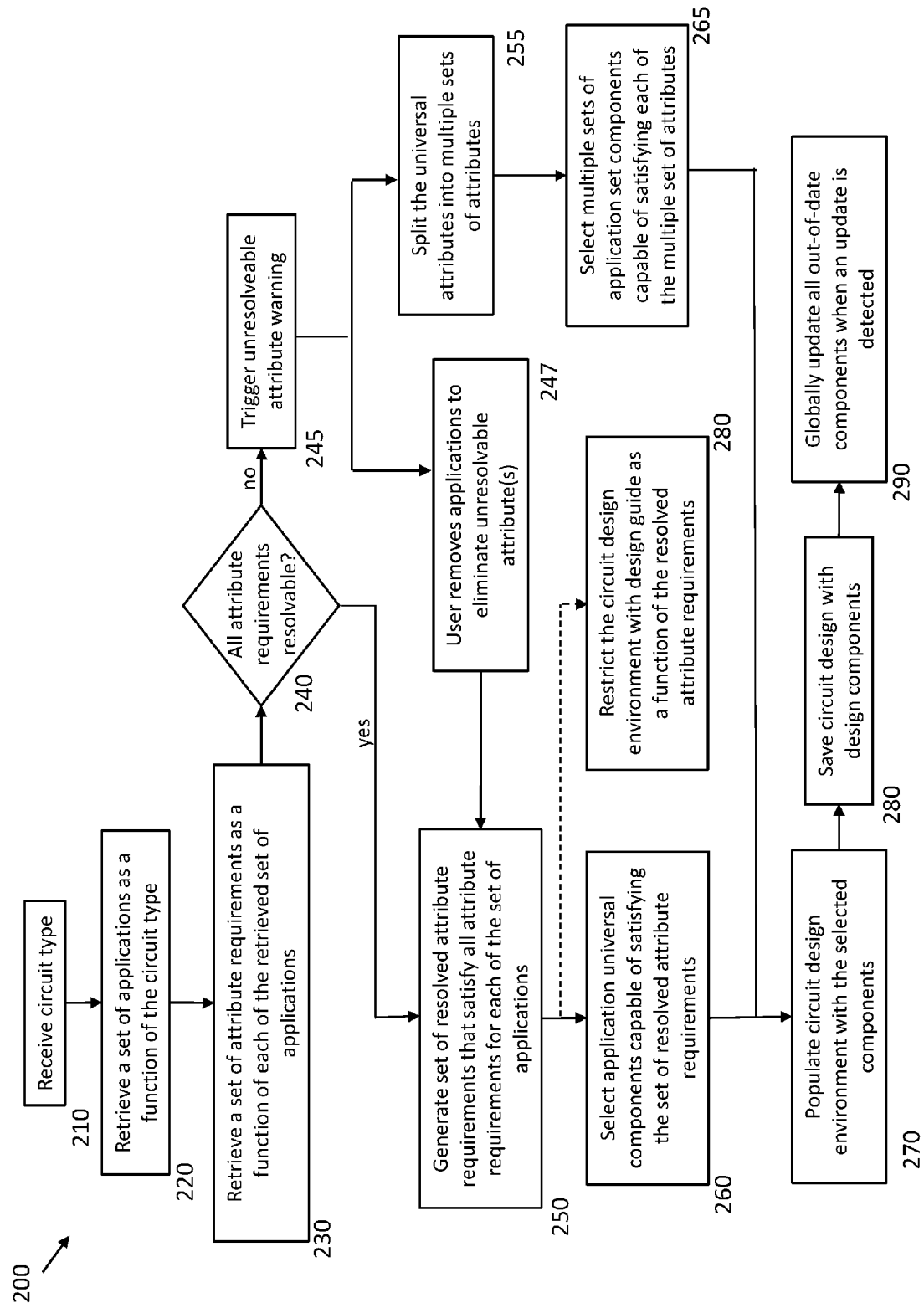
FIG. 2 shows a flowchart of an exemplary method to populate a circuit design environment.

In FIG. 2, an exemplary flow-chart 200 illustrates a decision tree that a universal circuit generation system could use to populate a circuit design environment.

In step 210, the system receives a circuit type from an entity. The entity could be a user of a user interface, or could be another computer system or computer program. In preferred embodiments the system presents the user with a list of circuit types to choose from, and the user selects a circuit type to generate. In other embodiments the user enters the circuit type into the system, which initiates a search for applications that correspond with the entered circuit type.

In step 220, the system retrieves a set of applications as a function of the circuit type. Preferably, the system queries a historical database, such as application database 130, to generate a set of applications that correspond with the received circuit type. Typically, the set of applications are received in the form of a set of application identifiers that identify applications and/or products which that circuit type has been used in. In some embodiments, the system provides a set of applications associated with the circuit type to the user, and the user selects a subset of the listed set of applications.

In step 230, the system retrieves a set of attribute requirements as a function of each of the retrieved set of applications. Preferably, the system queries a historical database, such as attribute requirement database 140, to generate a set of attribute requirements for each of the identified applications. In some embodiments, the system performs iterative searches for each application identifier, generating a list of attribute requirements. In some embodiments, the system provides a set of attribute requirements associated with the selected set of applications to the user, and the user selects a subset of the attribute requirements.

In step 240, the system determines whether or not all of the received attribute requirements are resolvable. That is, the system determines if it can generate a set of resolved attribute requirements that intersect every applicable set of attribute requirements. As used herein, an "applicable" set of attribute requirements are attribute requirements that are defined using the same schema such that they are capable of having an intersect. For example, one set of attribute requirements that are applicable to one another might define different output voltages (or ranges of output voltages) while another set of attribute requirements that are applicable to one another might define a resistance of certain types of components (or ranges of resistance). In some embodiments, the resolved attribute requirements may be used by the system to define one or more restrictions on the circuit design environment, or suggestions to the user from the circuit design environment. For example, where the system detects that different output voltages may be required by different respective applications (defining a variable output voltage), the system could require, or suggest, an input pin that defines the output voltage in the circuit design environment.

If the system determines that all of the received attribute requirements are resolvable, the system generates a set of resolved attribute requirements in step 250. Generally, the system generates a set of resolved attribute requirements for each applicable set of attribute requirements. For example, where a set of applicable attribute requirements for an output voltage of a component is 5V, 3.3V, 1.8V, 1.5V, 1.2V, and 0.6V, the system may generate an attribute requirement for components that can be manipulated to have an output voltage of 0.6V-5V. Generally, a resolved attribute requirement comprises a range of values or conditions that the universal circuit design must satisfy.

Once a set of resolved attribute requirements for the circuit type are generated by the system, the system generates a design guide as a function of the resolved attribute requirements. In some embodiments, the design guide comprises a checklist of limitations that are provided to a user to check before, during, and after designing the universal circuit to ensure that it satisfies all of the attribute requirements for each of the selected set of applications. In other embodiments, the design guide comprises a set of electrical, mechanical, and/or manufacturing attributes that the circuit design environment checks (e.g. when compiling the circuit or in response to a "check" command being sent by a user of the system) and highlights conflicts if any attribute of the universal circuit does not satisfy a resolved attribute requirement.

In step 260, the system selects universal components capable of satisfying the set of resolved attribute requirements. Preferably, the system queries a historical database, such as component database 150, to generate a set of application set components for each of the applicable resolved attribute requirements. The system generally submits the resolved attribute requirements to the database, which performs iterative searches for components that do not violate any of the resolved attribute requirements, and provides components that are all capable of satisfying the resolved attribute requirements.

In some embodiments, an admin user could enter each data element—circuit type, set of applications, and set of attribute requirements that have already been resolved by the user—and associates each data element with the new universal circuit design so that any future user of the universal circuit design can search for the universal circuit by any of the aforementioned data elements. In such embodiments, the system could skip steps 210, 220, 230, 240, and 250, and proceed directly to the output of step 250 to restrict the circuit design environment with the design guide and select universal components that are capable of satisfying the set of resolved attribute requirements entered in by the user. In some embodiments, the system presents the user with a set of application set components that correspond with the set of resolved attribute requirements, and the user could select a subset of the application set components with which to populate the circuit design environment.

Preferably, in step 270, the system automatically populates the circuit design environment with the selected application set components. Contemplated circuit design environments include CAD (computer aided design) software, such as those distributed by Cadence® and Synopsis®.

In step 280, the circuit design environment will also be restricted with resolved attribute requirements that have no correlative component. For example, a resolved attribute requirement may be to design a universal circuit with a tunable compensation network. In such embodiments, the circuit design environment will be restricted with a correlative test requirement. A test requirement for a tunable compensation network could be as simple as a checkbox that acknowledges that a tunable compensation network has been added to the universal circuit design, or could be a test for an output of the universal circuit to ensure that, despite fluctuations in the inputs to the universal circuit, the output voltage does not oscillate by more than a threshold amount.

Contemplated resolved attribute requirements that trigger restrictions on the circuit design environment comprise limiting the number of layers of the universal circuit design (preferably, only two layers—a top and bottom layer), inputs that define variables of the circuit (e.g. an input that defines a resistance of the universal circuit, an input that defines an output voltage of the universal circuit, an input that defines a flip-flop speed), a defined constraint region (typically auto-generated by the system as a function of the circuit type, and editable by the user), and physical dimensions of the universal circuit, via locations of the universal circuit. In some embodiments, these restrictions are mandatory (e.g. the user is unable to add a third layer to the universal design circuit), but preferably these restrictions trigger warnings when the user alters a variable of the universal circuit design in a manner that violates a requirement.

In step 245, the system may have detected that not all attribute requirements are automatically resolvable by the system, and therefore triggers a warning that at least one of the attribute requirements is not resolvable. In some embodiments, the user may manually resolve some or all of the unresolvable attributes in step 247, and allows the system to algorithmically resolve the resolvable attributes in step 250.

In some embodiments, an attribute requirement may not be resolvable with other applicable attribute requirements, which requires the system to branch out and create two or more circuit design environments. In such situations, the system may generate two or more sets of semi-resolved attribute requirements. A set of semi-resolved attribute requirements are attributes that do not intersect all of the attribute requirements gleaned by the system, but comprise at least one semi-resolved attribute requirement that intersects at least two of the attribute requirements gleaned by the system. Preferably, the system minimizes the number off sets of application set components to ensure that a minimum number of application sets are generated by the process. In step 265, multiple sets of semi-application set components are selected by the system, one for each set of semi-resolved attribute requirements.

When the system has a selected set of universal components, the system then populates the circuit design environment with the selected components in step 270. The user could then design a new universal circuit design using the selected components, ensuring that the components are all capable of satisfying the multiple attribute requirements of a set of applications.

In some embodiments, the system also restricts the circuit design environment with a corresponding set of resolved attribute requirements. For example, the system could require that the circuit design environment only have two layers, could require a threshold number of input setting pins as a function of the resolved attribute requirements, or could require a localized constraint region to be defined by the user.

Once a user starts designing a circuit design, at any time the user may save the circuit design to memory in step 280. The system will also periodically globally update all out-of-date components when an update is detected. In some embodiments, the system may periodically check when any of the components saved in a circuit design has been updated, and may automatically update the components or may prompt a user for a global replacement. In other embodiments, the component database may push new components to all currently saved circuit designs. In preferred embodiments, the system checks if a component has been updated in response to a stimuli from a user, for example when the user opens a save file, or when the user executes a "compile circuit" command. Such triggers could initiate an automatic check against a component database for any components that have an updated version, and could prompt the user to execute a command to globally replace all out-of-date components with updated versions. Since the components are preferably required to have the same footprint as before by the component database, all components of a universal circuit design could be replaced without having to re-import, re-position, and/or re-connect updated components across the entire universal circuit design. This ensures that a user who wishes to use the most up-to-date components can.

Figure 3:
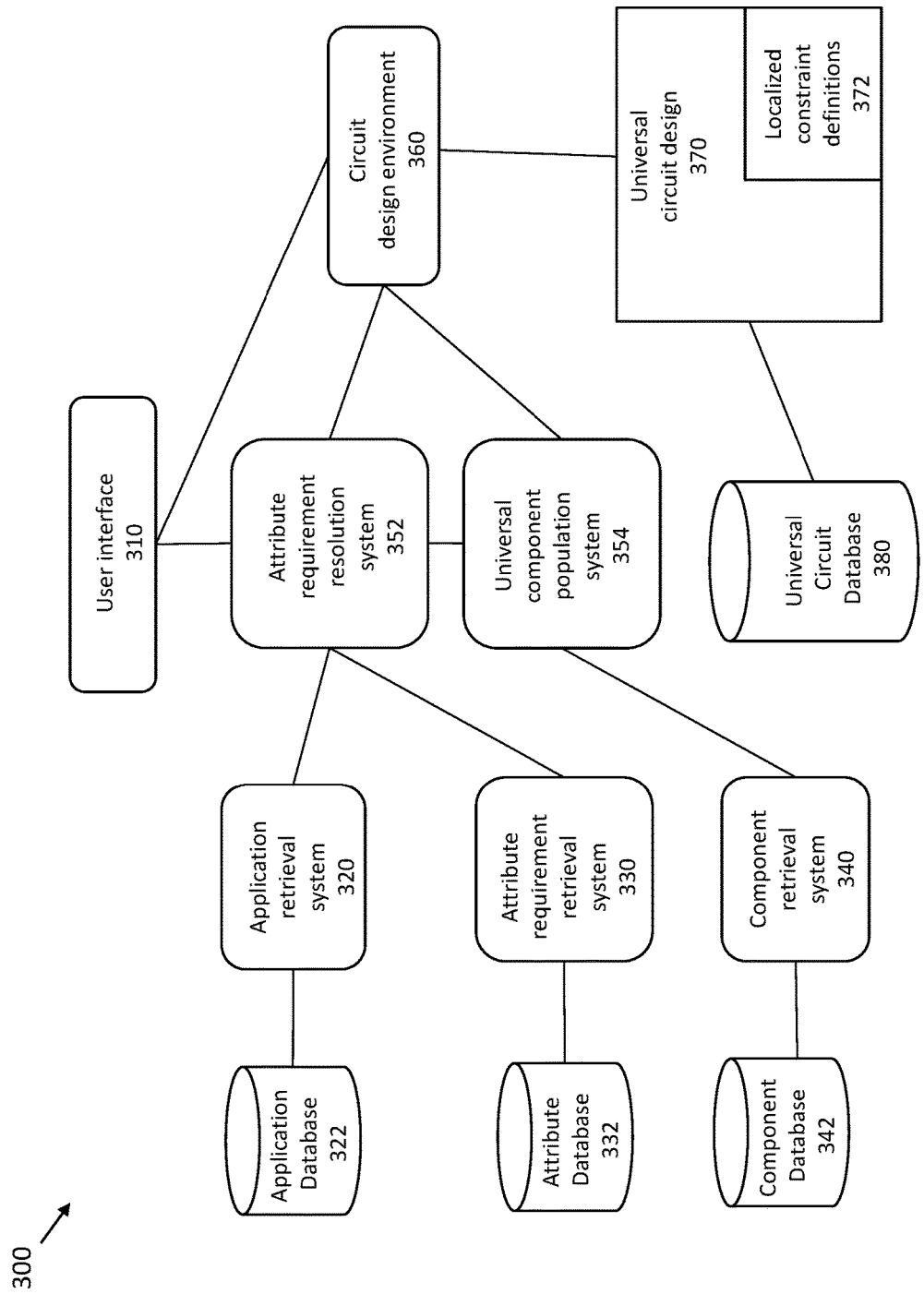
FIG. 3 shows an exemplary software infrastructure that generates a universal circuit design.

In FIG. 3, a software schematic 300 has a user interface 310 that communicates with attribute requirement resolution system 352 to set up circuit design environment 360 with a design guide and universal components that ensure that a universal circuit design 370 is built to satisfy a wide variety of applications for a given circuit type.

User interface 310 typically interfaces with standard user interface hardware for a computer system, such as a keyboard, monitor, and mouse, but could comprise any suitable user interface capable of allowing a user to interact with resolved attribute requirement system 352. Contemplated users include an admin user designing the system or a chip designer designing universal circuit design 370. Attribute requirement resolution system 352 preferably coordinates with application retrieval system 320 and attribute requirement retrieval system 330 to generate a set of resolved attribute requirements that satisfy all known application requirements for selected applications of a selected circuit type. Attribute requirement resolution system 320 retrieves a set of applications associated with a selected circuit type from application database 322, which could be pared down or otherwise edited via user interface 310. The set of applications could then be provided to attribute requirement retrieval system 330 to retrieve a set of attribute requirements associated with each of the set of applications, which could also be pared down or otherwise edited via user interface 310. Attribute requirement resolution system 352 could then generate a set of resolved attribute requirements, which are used to generate a design guide that ensures that the resolved attribute requirements are satisfied. In some embodiments, the design guide is provided to a user to apply the limitations manually, while in other embodiments the design guide is applied directly to circuit design environment 360 to prevent a user from creating a universal circuit design that violates any of the resolved attribute requirements.

At least a portion of the resolved attribute requirements are provided to universal component population system 354, which queries component database 342 via component retrieval system 340 to glean universal components that can satisfy the resolved attribute requirements. These universal components could also be provided to user interface 310 directly, or are provided directly to circuit design environment 360 as a library from which a user can pull components for the universal circuit design.

In some embodiments, attribute requirement resolution system 352 is programmed to analyze the resolved attribute requirements and generate a minimum number of select lines that may be required by the universal circuit to satisfy the full range of resolved attribute requirements. As used herein, a "select line" allows a user of the universal circuit to enable/disable/set parameters of the universal circuit. For example, a universal circuit may have an "efficiency mode" that can be enabled/disabled by a select line to improve the circuit's performance at the cost of power drain or vice-versa, or may have a "voltage set" line that sets the maximum voltage across the universal circuit.

Attribute requirement resolution system 352 also preferably auto-populates at least one localized constraint definition 372 for the universal circuit design 370, which supersedes the top level board environment when the universal circuit design is used in a chip. Preferred universal circuit designs have two separate constraint regions, one for the top layer of the universal circuit and one for the bottom layer of the universal circuit. Once the universal circuit design is generated, the system can save it in universal circuit database 380.

In some embodiments, a user may wish to update an existing universal circuit saved in universal circuit database 380. In such embodiments, the user pulls the universal circuit design from the database into circuit design environment 360, and updates base restrictive values, such as the type of component used, an attribute requirement, or even an application that the universal circuit can be applied to. Circuit design environment 360 preferably does not allow a user to alter a base footprint of an existing universal circuit, such as the location and number of inputs/outputs to the universal circuit. The user may also redesign portions of the universal circuit design, such as the constraint region or the location or routing of vias, and saves the new, updated version of the universal circuit in universal circuit database 380.

Figure 4:
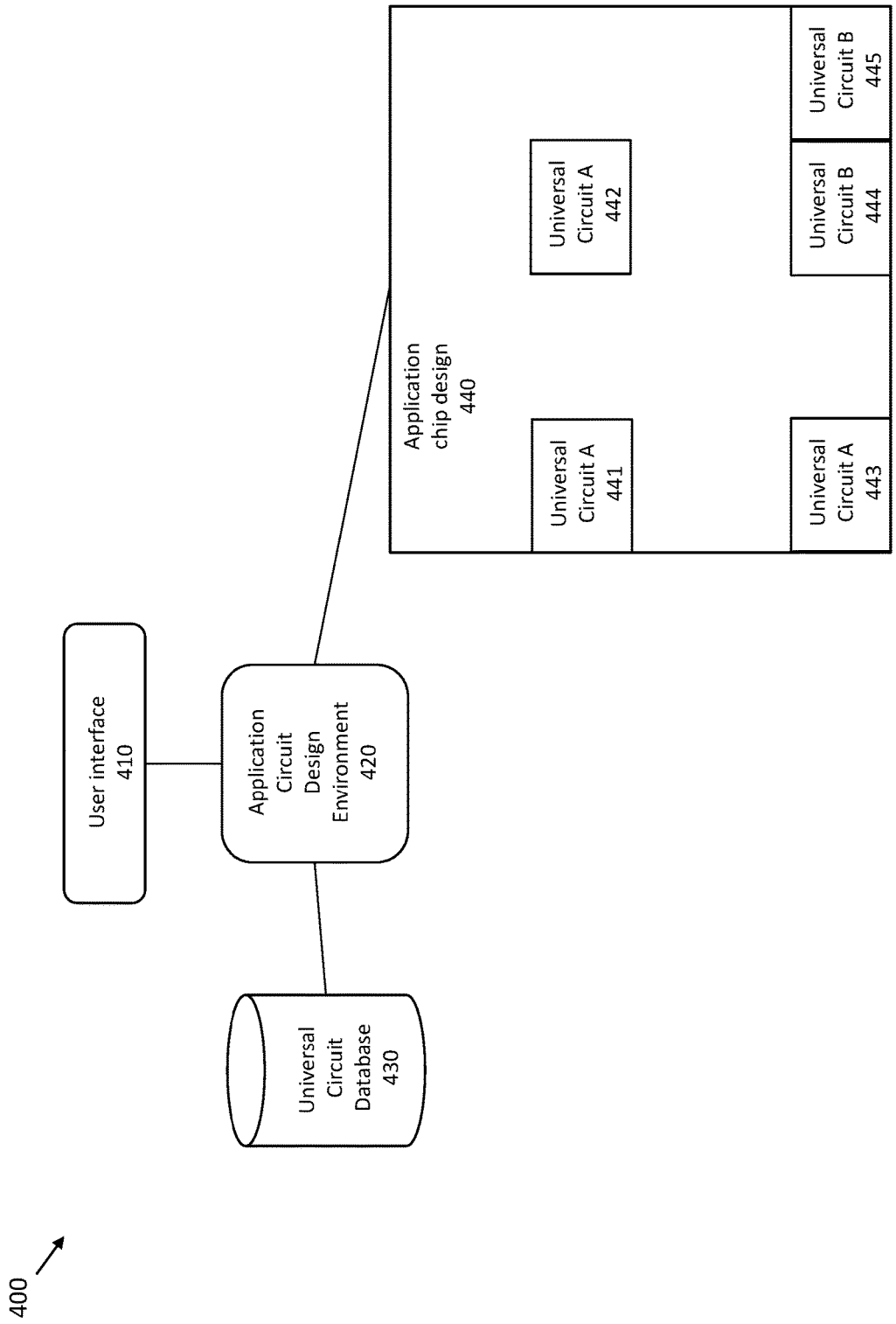
FIG. 4 shows an exemplary software infrastructure that utilizes a generated universal circuit design.

In FIG. 4, a software schematic 400 has an application circuit design environment 420 that communicates with a user interface 410 to use universal circuit designs saved in universal circuit database 430 in a chip design for a specific application 440. Here, a user has used a first universal circuit design, universal circuit design A, thrice as circuit 441, circuit 442, and circuit 443, and has used a second universal circuit design, universal circuit design B, twice as circuit 444 and 445. When a master template for a universal circuit, such as universal circuit design A, is updated by universal circuit database 430, a user can preferably transmit an update command to application circuit design environment 420 to automatically update all instances of universal circuit design A—universal circuits 441, 442, and 443—in application chip design 440 without needing to copy/paste the updated circuit components in every instance of the application chip design.

Thus, systems and methods for assisting a user in generating a universal circuit design are disclosed. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure all terms should be interpreted in the broadest possible manner consistent with the context. In particular the terms "comprises" and "comprising" should be interpreted as referring to the elements, components, or steps in a non-exclusive manner, indicating that the referenced elements, components, or steps can be present, or utilized, or combined with other elements, components, or steps that are not expressly referenced.

What is claimed is:

1. A system that generates a circuit design, comprising a non-transitory computer-readable medium storing instructions that, when executed by a computer processor, perform the steps of:
   receiving a circuit type from a first user interface;
   retrieving a set of applications corresponding to the circuit type;
   retrieving a set of attribute requirements corresponding to each of the set of applications;
   generating, for each resolvable attribute requirement, a set of resolved attribute requirements that intersect applicable sets of attribute requirements for each of the set of applications;
   selecting application set components that do not violate any of the set of resolved attribute requirements; and
   populating a circuit design environment with the selected application set components to generate the circuit design.

2. The system of claim 1, wherein the set of resolved attribute requirements comprise at least one of electrical attributes, physical attributes, thermal attributes, and feature requirements.

3. The system of claim 2, wherein the electrical attributes comprise at least one of capacitance, voltage, current, efficiency and EMI.

4. The system of claim 2, wherein the physical attributes comprise at least one of a maximum height.

5. The system of claim 2, wherein the thermal attributes comprise at least one of a minimum temperature, a maximum temperature, and required airflow.

6. The system of claim 2, wherein the feature requirements comprise at least one of a discrete compensation component requirement, an I/O logic requirement, a power good requirement, or a fault signal requirement.

7. The system of claim 2, further comprising generating a set of common preset requirements as a function of the set of resolved attribute requirements and providing the set of common preset requirements to the circuit design environment.

8. The system of claim 7, wherein the instructions, when executed by the computer processor, further deactivate features of the circuit design environment as a function of the set of common preset requirements.

9. The system of claim 8, wherein one of the deactivated features comprises an ability to add a third circuit layer to the circuit design.

10. The system of claim 1, wherein the instructions, when executed by the computer processor, further provides at least one of the set of resolved attribute requirements to the circuit design environment as a violation condition.

11. The system of claim 10, wherein the circuit design environment transmits a warning when a portion of the circuit design violates the violation condition.

12. The system of claim 1, wherein the instructions, when executed by the computer processor, further require the circuit design environment to have at least one set of localized constraint region parameters dedicated to the circuit design.

13. The system of claim 12, wherein the instructions, when executed by the computer processor, further generate a set of localized constraint definitions specific to each of the set of applications.

14. The system of claim 13, wherein the localized constraint region comprises inputs that modify attributes of the circuit design.

15. The system of claim 13, wherein the instructions, when executed by the computer processor, further cause the computer processor to:
   generate the circuit design using at least one of the selected application set components;
   receive a selected application from a second user interface, wherein the selected application composes the set of applications; and
   modify the circuit using the at least one set of localized constraint region parameters as a function of the selected application.

16. The system of claim 15, wherein the instructions, when executed by the computer processor, further cause the computer processor to:
   generate the circuit design using at least one of the selected application set components;
   receive a selected application from a second user interface, wherein the selected application composes the set of applications;
   select the localized constraint definitions specific to the selected application; and
   modify the circuit using the selected localized constraint definitions.

17. A method of populating a circuit design environment with selected application set components, comprising:
   receiving a circuit type;
   retrieving a set of applications as a function of the circuit type;
   retrieving a set of attribute requirements as a function of each of the set of applications;
   generating a set of resolved attribute requirements that intersect each of the set of attribute requirements for each of the set of applications;
   selecting the selected application set components capable of satisfying the set of resolved attribute requirements; and
   populating a circuit design environment with the selected application set components.

18. The method of claim 17, further comprising generating a set of localized constraint region definitions specific to the circuit design.

19. The method of claim 17, further comprising:
   receiving a selected application, wherein the set of applications comprises the selected application; and
   modifying the localized constraint region definitions as a function of the selected application.

20. A computer system that generates a circuit design, comprising:
   an application database that correlates applications with circuit types;
   an attribute requirement database that correlates attribute requirements with applications;
   a circuit component database that correlates circuit components with attribute requirements;
   a user interface that receives a selected circuit type;
   an application set component generator programmed to:

retrieve a set of applications from corresponding to the circuit type from the application database;

retrieving a set of attribute requirements corresponding to each of the set of applications from the attribute requirement database;

generate set of resolved attribute requirements that intersect each of the set of attribute requirements for each of the set of applications; and retrieve application set components capable of satisfying the set of resolved attribute requirements from the circuit component database; and a circuit design environment that receives the application set components from the application set component generator and uses only a set of the application set components to generate the circuit design.

21. The computer system of claim 20, wherein the circuit design environment further generates a set of localized constraint region definitions specific to the circuit design.

* * * * *